(12) United States Patent
Lim

(10) Patent No.: US 6,429,908 B1
(45) Date of Patent: Aug. 6, 2002

(54) METHOD FOR MANUFACTURING A GATE OF THIN FILM TRANSISTOR IN A LIQUID CRYSTAL DISPLAY DEVICE

(75) Inventor: Byoung Ho Lim, Kyungsangbook-do (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/146,460

(22) Filed: Aug. 19, 1998

(30) Foreign Application Priority Data

Sep. 30, 1997 (KR) .......................................... 97-50588

(51) Int. Cl.$^7$ .......................... G02F 1/1333; G02F 1/13
(52) U.S. Cl. .............................. 349/54; 349/40; 349/192
(58) Field of Search ............................ 349/54, 192, 40; 345/93

(56) References Cited

U.S. PATENT DOCUMENTS

| | | | | |
|---|---|---|---|---|
| 4,807,973 A | * | 2/1989 | Kawasaki | 350/332 |
| 4,840,459 A | * | 6/1989 | Strong | 350/333 |
| 5,159,477 A | * | 10/1992 | Shimada et al. | 359/59 |
| 5,202,778 A | * | 4/1993 | Niki | 359/54 |
| 5,608,558 A | * | 3/1997 | Katsumi | 349/192 |
| 5,668,032 A | * | 9/1997 | Holmberg et al. | 438/144 |
| 5,684,547 A | * | 11/1997 | Park et al. | 349/54 |
| 5,729,309 A | * | 3/1998 | Na et al. | 349/54 |
| 5,734,450 A | * | 3/1998 | Irie et al. | 349/192 |
| 5,767,929 A | * | 6/1998 | Yachi et al. | 349/40 |
| 5,805,246 A | * | 9/1998 | Lee et al. | 349/40 |
| 5,831,709 A | * | 11/1998 | Song | 349/192 |
| 5,852,305 A | * | 12/1998 | Lee et al. | 349/54 |
| 5,859,679 A | * | 1/1999 | Song | 349/54 |
| 5,995,178 A | * | 11/1999 | Fujikawa et al. | 349/55 |
| 6,111,621 A | * | 8/2000 | Kim et al. | 349/54 |

FOREIGN PATENT DOCUMENTS

| JP | 5-341312 | 12/1993 |
|---|---|---|
| JP | 07175085 | 7/1995 |

* cited by examiner

*Primary Examiner*—William L. Sikes
*Assistant Examiner*—Tarifur R. Chowdhury
(74) *Attorney, Agent, or Firm*—Birch, Stewart, Kolasch & Birch, LLP.

(57) ABSTRACT

A method and structure for reducing the resistivity of a repair line in an active panel includes a repair line made of a gate material and a method for manufacturing the same. All parts of the repair line comprise low resistivity metal such as aluminum or copper so that a detoured data signal is not delayed.

24 Claims, 8 Drawing Sheets

METHOD FOR MANUFACTURING A GATE OF THIN FILM TRANSISTOR IN A LIQUID CRYSTAL DISPLAY DEVICE

BACKGROUND OF THE INVENTION

1. Field of the Invention

The present invention relates to a thin film transistor panel (or TFT panel) of a liquid crystal display device (or LCD), and more specifically, to a method for reducing the resistivity of a repair line in the TFT panel (or active panel).

2. Description of the Background Art

Figure 1:
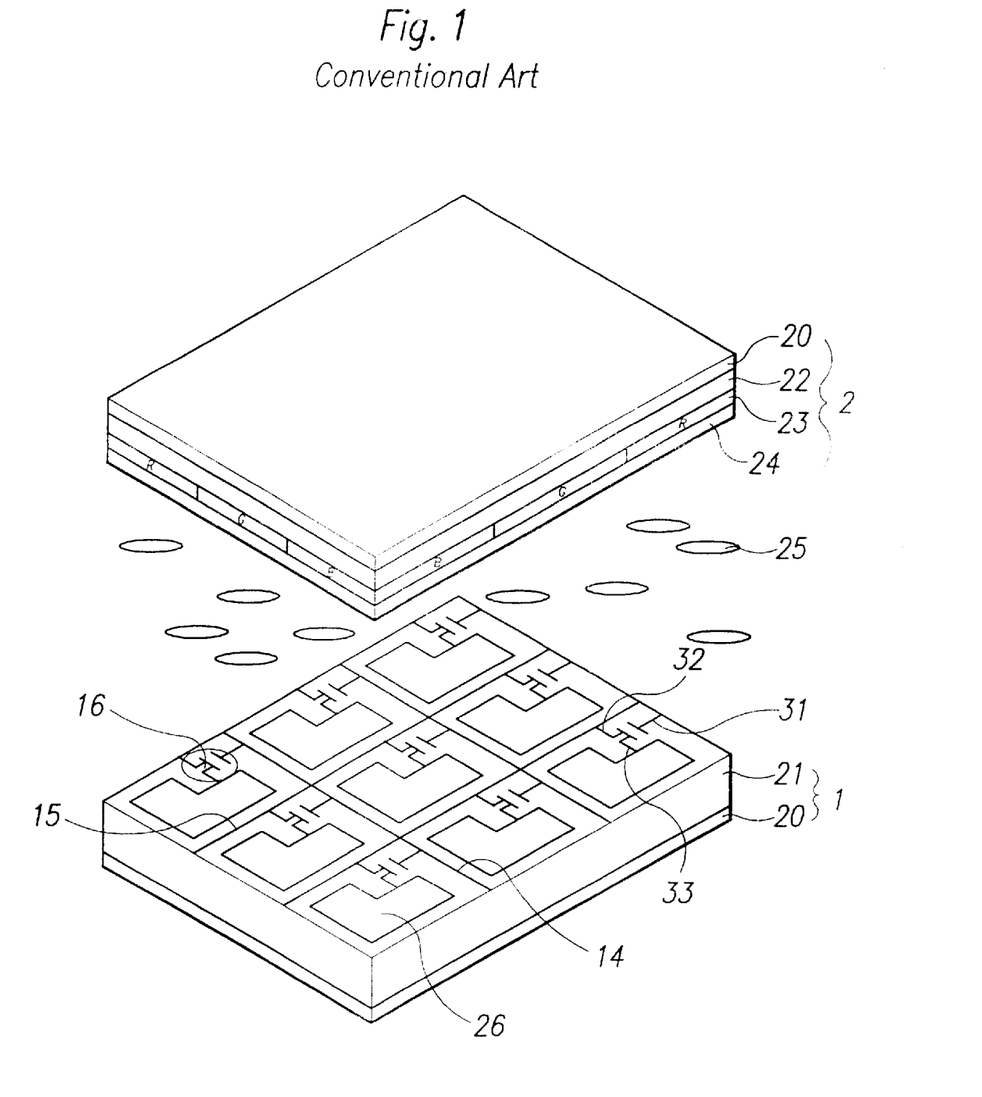
FIG. 1 is a perspective view illustrating a conventional active panel.

A conventional liquid crystal display device comprises an active panel and a driving circuit. The active panel, as shown in FIG. 1, comprises an upper panel 2 and a lower panel 1 which are arranged to face each other and to be joined together with a liquid crystal material 25 located therebetween. The upper panel 2 comprises a polarizing panel 20, a transparent substrate 22, a color filter 23 and a common electrode 24 all of which are disposed on the transparent substrate 22. The lower panel 1 comprises a polarizing panel 20, a transparent substrate 21, a plurality of gate lines 14 disposed on the transparent substrate 21, a plurality of data lines 15 which are perpendicularly crossed with the gate lines 14 and a pixel electrode 26 and a thin film transistor 16 which are disposed at the intersection portion of the gate lines 14 and the data lines 15. Pads (not shown in FIG. 1) are formed at the ends of the gate lines 14 and the data lines 15 and have a width that is larger than a width of the respective gate and data lines. The lower panel 1 is divided into a displaying area in which the pixel electrode 26 and the thin film transistor 16 are formed and a pad area in which pads connected to the ends of the gate lines 14 and the data lines 15 are formed.

The thin film transistor comprises a gate electrode 31 connected to the gate line 14, a source electrode 32 connected to the data line 15 and a drain electrode 33 connected to the pixel electrode 26. Generally, the gate electrode 31 and the gate line 14 are formed during the same processing step. Also, the data line 15, the source electrode 32 and the drain electrode 33 are formed during the same processing step.

Figure 2A:
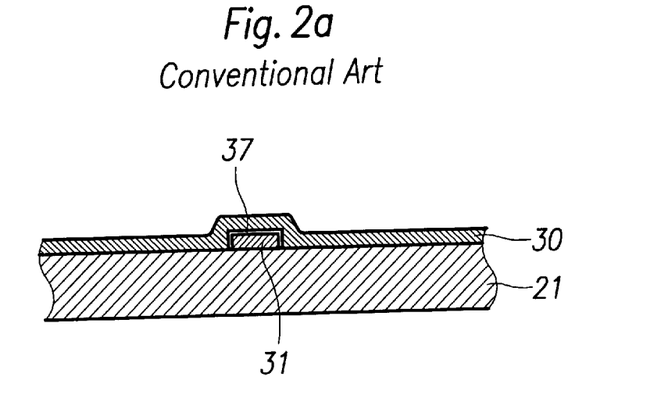
FIGS. 2a–2c are cross-sectional views illustrating a conventional method for manufacturing a thin film transistor in an active panel.
Figure 2B:
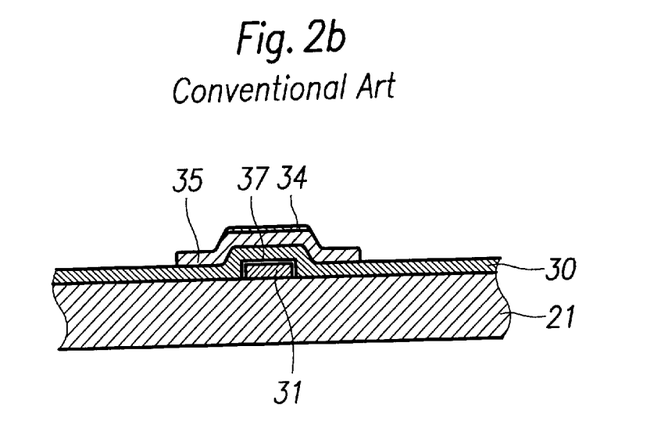
Figure 2C:
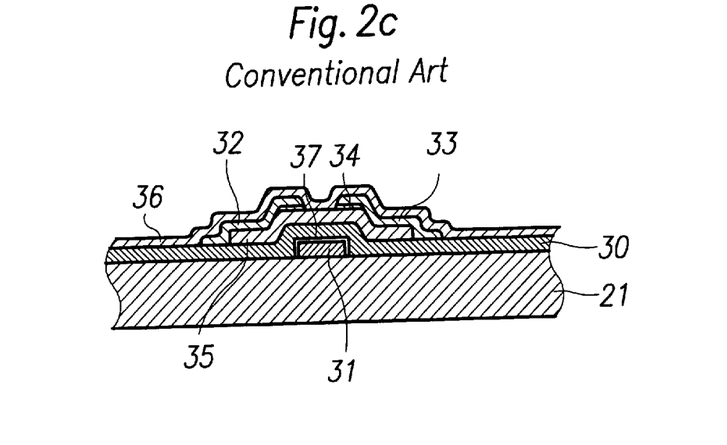

The manufacturing process of the TFT is described with reference to FIGS. 2a–2c. At first, the gate electrode 31 is formed on the transparent substrate 21 of the lower panel 1. An oxidation layer 37 is then formed on the gate electrode 31. Then, an insulating layer 30 is formed so as to cover the gate electrode 31 and the oxidation layer 37. A semiconductor layer 35 is formed on the insulating layer 30 so as to cover the gate electrode 31. An impurity doped semiconductor layer 34 is formed on the semiconductor layer 35. After that, the source electrode 32 and the drain electrode 33 are formed on the doped semiconductor layer 34 and the insulating layer 30. The doped semiconductor layer 34 is patterned by using the source electrode 32 and the drain electrode 33 as a mask. Therefore, the portion of the doped semiconductor layer 34 disposed between the source electrode 32 and the drain electrode 33 is removed. Finally, a passivation layer 36 covering the resulting substrate 21 is formed so that the TFT is completed. The gate line 14 and the gate pad (not shown) are formed at the same time that the gate electrode 31 is formed. The data line 15 and the data pad 40 are formed at the same time that the source electrode 32 and the drain electrode 33 are formed.

In order to increase the resolution of the LCD, many data lines are required. If one data line is broken, then the whole panel can not be used. So, it is necessary prepare an additional line, called a repair line, for repairing a broken line and preventing a broken line from rendering the whole panel unusable. Generally, the repair line is disposed around a periphery of the active panel. The horizontal portion of the repair line is disposed at a location where the gate lines intersect the gate pads and the vertical portion of the repair line is disposed at a location where the data lines intersect the data pads.

Figure 3A:
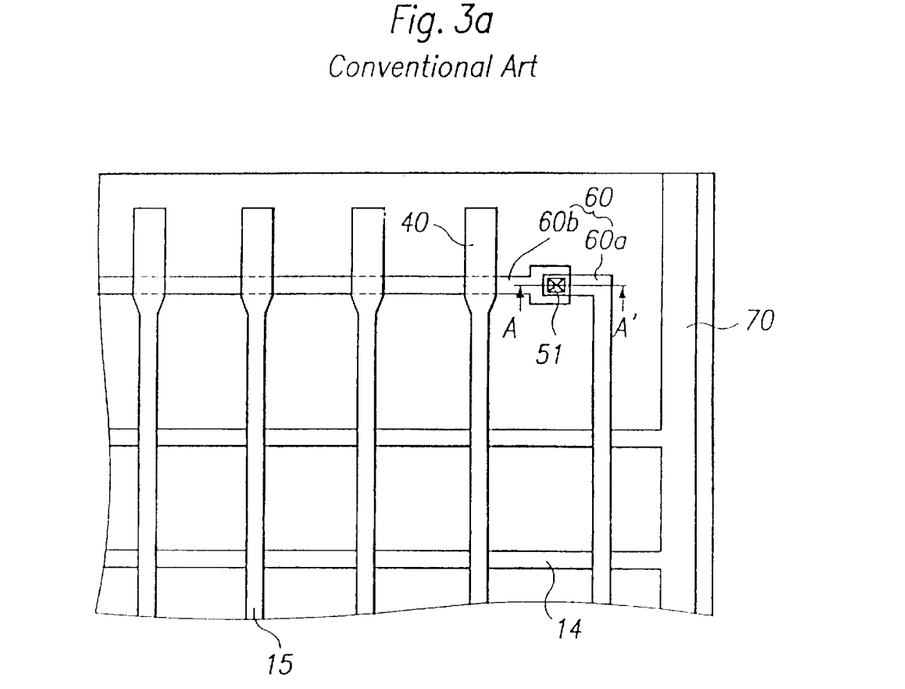
FIGS. 3a and 3b are plan views showing the conventional active panel having a repair line, a gate line and a gate pad.
Figure 3B:
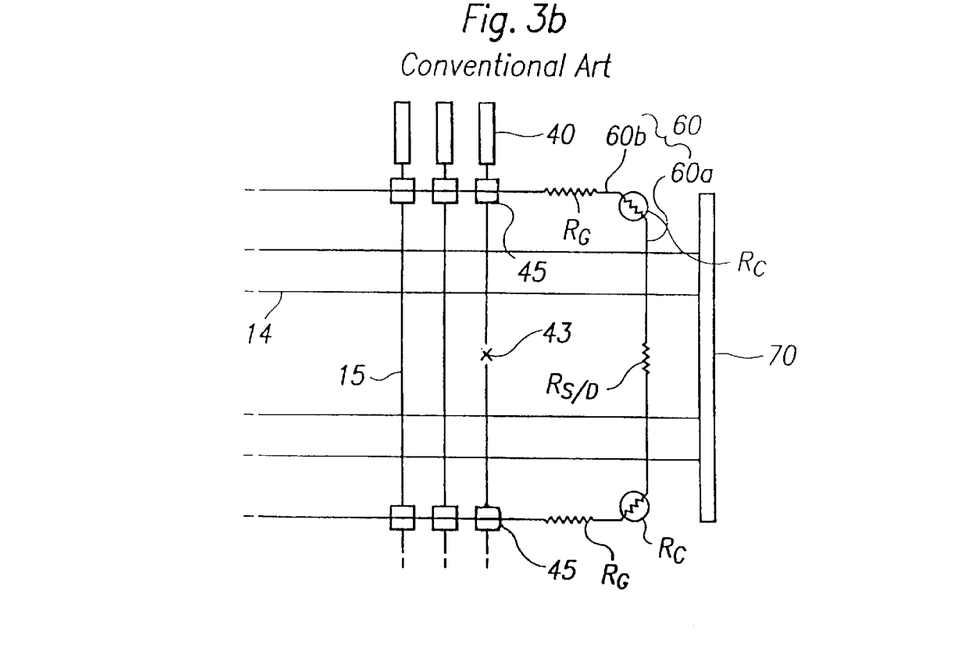
Figure 3C:
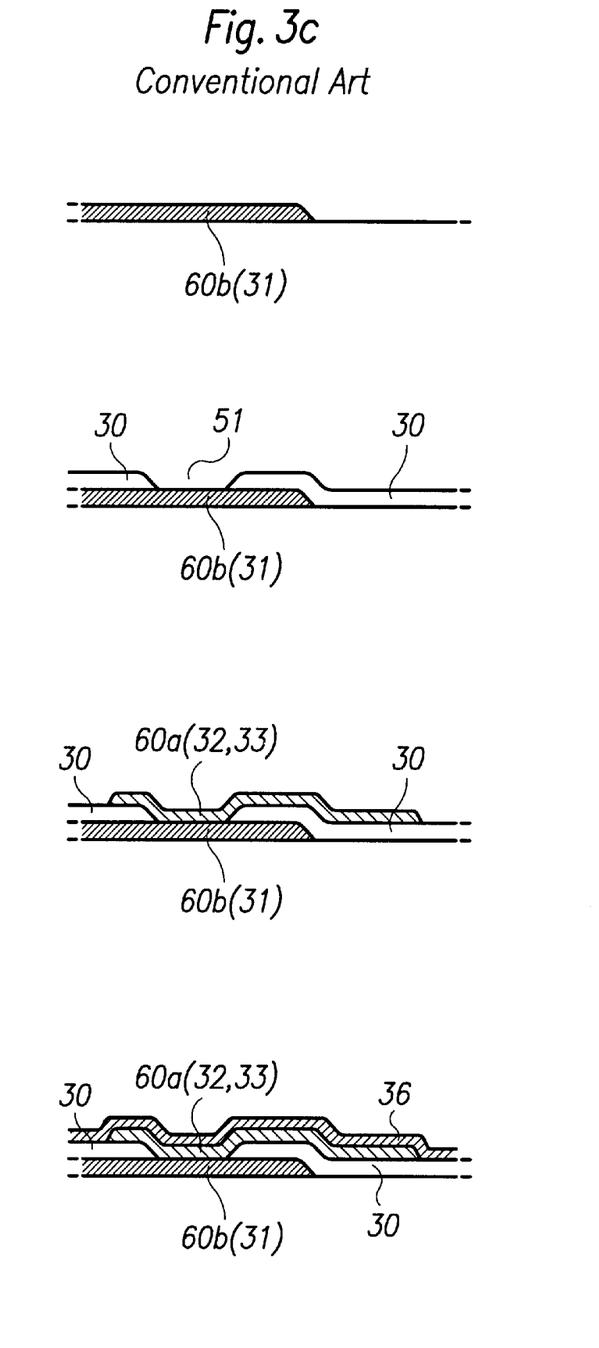
FIG. 3c provides cross sectional views showing the conventional method for manufacturing the repair line.

FIG. 3a shows the active panel having the data pads 40, data lines 15 and the repair line 60 in detail. FIG. 3b shows another diagram of the active panel according to the conventional art. The repair line 60 comprises a gate line crossing portion 60a and a data line crossing portion 60b. The data line crossing portion 60b of the repair line 60 is formed at the same time that the gate line 14 is formed and the gate line crossing portion 60a of the repair line 60 is formed at the same time that the data line 15 is formed. These two portions of the repair line 60 are connected to each other through a contact hole 51. Referring to the FIG. 3c showing a cross section along the cutting line A—A of FIG. 3a, the manufacturing process of making and connecting the two portions of the repair line 60 in the conventional art is explained.

At first, the data line crossing portion 60b of the repair line 60 is formed at the same time that the gate electrode 31, the gate line 14, the gate pad (not shown) and a common line 70 are formed. Here, the common line 70 which preferably comprises an anti-electrostatic ground line, prevents an electrostatic capacitance from being formed when the gate lines are separated from each other. Then, a gate insulation layer 30 is deposited thereon. The gate insulation layer 30 has a contact hole 51 exposing an end portion of the data line crossing portion 60b of the repair line 60. Then the gate line crossing portion 60a of the repair line 60 is formed at the same time that the source electrode 32, the drain electrode 33, the data line 15 and the data pad 40 are formed. The gate line crossing portion 60a of the repair line 60 is connected to the exposed portion of the data line crossing portion 60b of the repair line 60 through the contact hole 51.

If a data line 15 is broken by a defect 43, then the intersection point 45 of the data line 15 and the repair line 60 is connected. So, the data signal applied to the data line 15 having a defect 43 is detoured through the repair line 60. Hence the broken data line 15 appears to be repaired.

The data line crossing portion 60b of the repair line 60 comprises the same material of the gate electrode 31 and the gate line crossing portion 60a of the repair line 60 comprises the same material as that of the source electrode 32 and the drain electrode 33. So, the data line crossing portion 6b comprises a low resistance metal such as aluminum or copper. On the other hand, the gate line crossing portion 60a comprises a high resistance conductive material such as chromium or indium-tin-oxide (or ITO). Therefore, the resistance of the repair line 60 is related to the sum of the resistance of the two contacts, i.e., the gate material and source material, $R_G+2R_c+R_{S/D}$, where $R_G$ is the resistivity of the gate material, $R_c$ is a contact resistance at the data line crossing portion 60b and the gate line crossing portion 60a of the repair line 60 and $R_{S/D}$ is the resistivity of the source material. Hence, the resistance of the repair line 60 is higher than any other part of the active panel.

In this structure, if a data line 15 which is located far from the repair line 60 has a defect 43, then the data line signal traveling the detoured course is significantly delayed by the high resistance of the repair line 60 so that the repair line 60 does not properly work as a repair line. As a result, a repairing area provided by the repair line 60 is limited to only an area located very near to the repair line 60.

SUMMARY OF THE INVENTION

To overcome the problems described above, the preferred embodiments of the present invention provide a repair line having a low resistance and having an unlimited or maximum repairing area provided by the low resistance repair line.

According to a preferred embodiment of the present invention, an active panel includes a repair line made of a gate material and a method for manufacturing the same. In the preferred embodiments of the present invention, all parts of the repair line are formed when the gate electrode is formed. Therefore, the repair line comprises low resistance metal such as Al, AlNd, Mo and Cu so that any signal delay occurring at the detoured data line is significantly reduced.

According to preferred embodiments of the present invention, an active panel comprises a display area having a common line and a gate line, a repair line surrounding the display area and crossing the common line, a pad area including a data pad and a gate pad which are located at an area outside of the repair line, wherein the repair line includes a material used to form the gate line.

Other features and advantages of the present invention will become apparent from the following description of preferred embodiments of the invention which refers to the accompanying drawings, wherein like reference numerals indicate like elements to avoid duplicative description.

DETAILED DESCRIPTION OF PREFERRED EMBODIMENTS

Figure 4A:
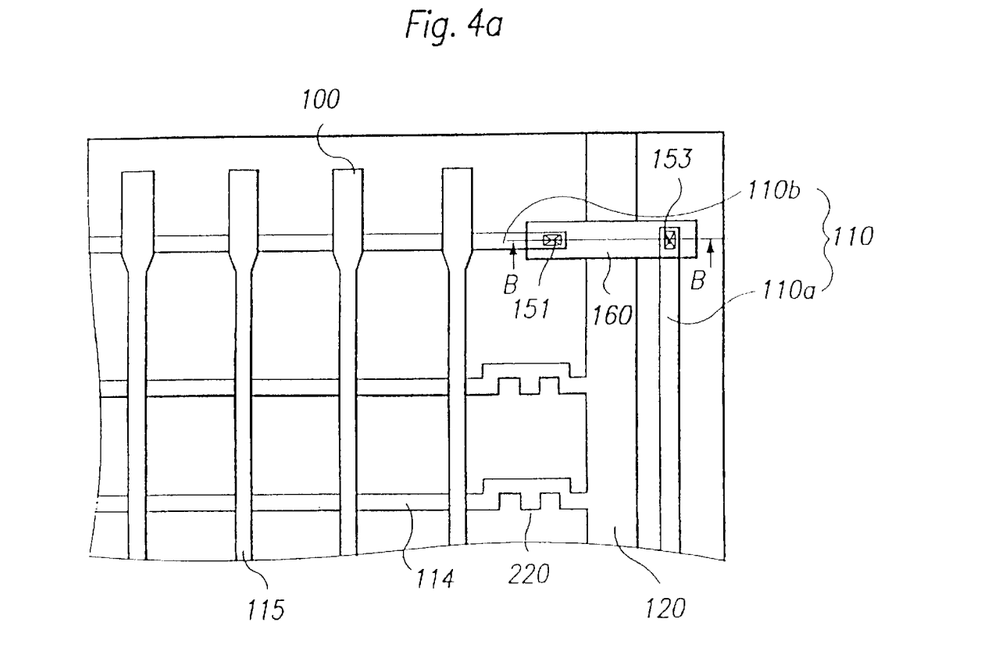
FIGS. 4a and 4b are plan views showing an active panel having a repair line, a gate line and a gate pad according to a first preferred embodiment of the present invention.
Figure 4B:
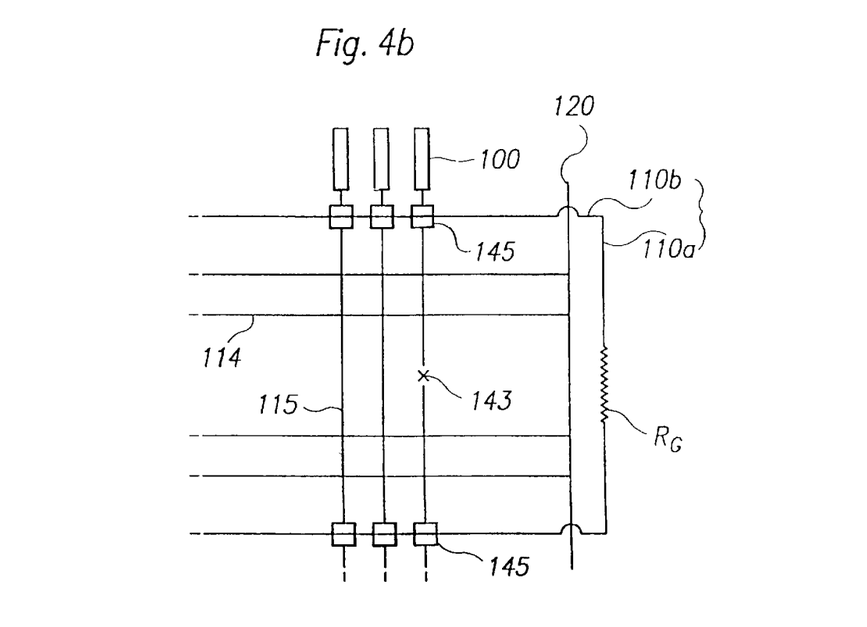
Figure 4C:
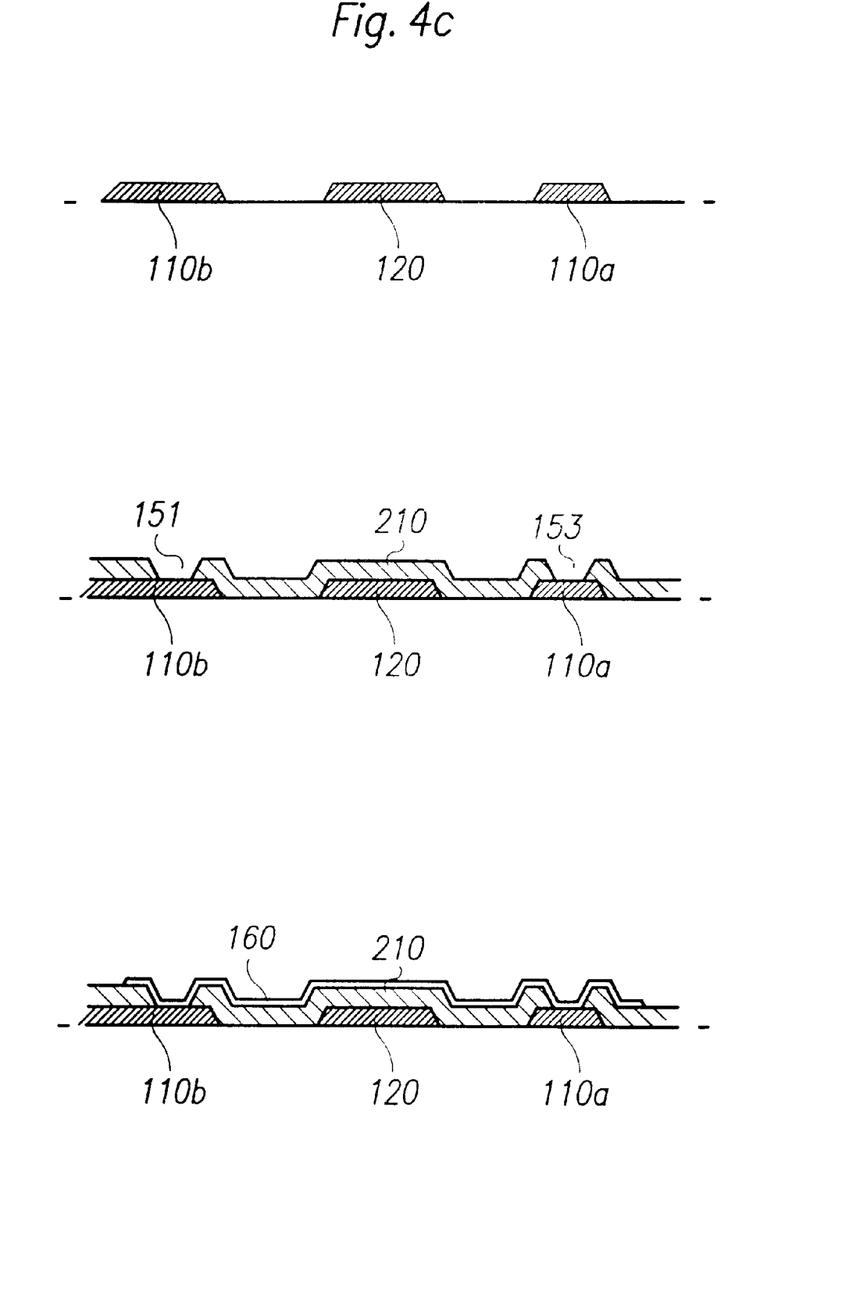
FIG. 4c provides cross sectional views showing a method for manufacturing the repair line according to the first preferred embodiment of the present invention.

Referring to FIG. 4a showing a plan view of an active panel, FIG. 4b showing another diagram of FIG. 4a and FIG. 4c showing a cross sectional view along the section line B—B in FIG. 4a, the first preferred embodiment of the present invention will be explained in detail.

A repair line 110 is preferably formed at the same time that a gate electrode (not shown), a gate line 114 and a gate pad (not shown) are formed using a low resistance metal such as Al, AlNd, Mo and Cu. The repair line 110 comprises a horizontal portion 110b and a vertical portion 110a. The horizontal portion 110b is disposed at a location at which the data line 115 is connected to the data pad 100. The vertical portion 110a is disposed at an area outside of a common line (anti-electrostatic ground line) 120 of the gate line 114 and gate pad (not shown). The gate line 114 is connected to the common line 120 through an anti-electrostatic circuit 220, as shown in FIG. 4a.

Thus, all portions of the repair lines 110 comprise the low resistance material and all repair lines 110 are made completely of the same low resistance material. Therefore, if a data line 115 is broken by a defect 143, an intersection point 145 of the data line 115 and the repair line 110 is connected. Generally, a preferred connection method is to weld the intersection point 145 using a laser beam. So, the data signal applied to the data line 115 having a defect 143 is detoured through the repair line 110. As a result, the broken data line 115 is repaired, as shown in FIG. 4b.

Because the repair line 110 is formed at the same time that the gate line 114 and the common line 120 are formed, and the repair line 110 is disposed outside of the common line 120, it is important how the repair line 110 is insulated with the common line 120. As is shown in FIG. 4a, the portions 110a and 110b of the repair line are divided into two parts and connected with a connector 160 through contact holes 151 and 153. In this preferred embodiment, it is preferable that the repair line 110 is divided into a horizontal portion 110b and a vertical portion 110a in the same layer. After the gate insulating layer 210 is deposited, contact holes 151 and 153 exposing some of the two portions 110b and 110a of the repair line 110, respectively, are formed and as a result, the two portions of the repair line are connected by a connector 160 comprising a source material, as shown in FIG. 4c.

Figure 5A:
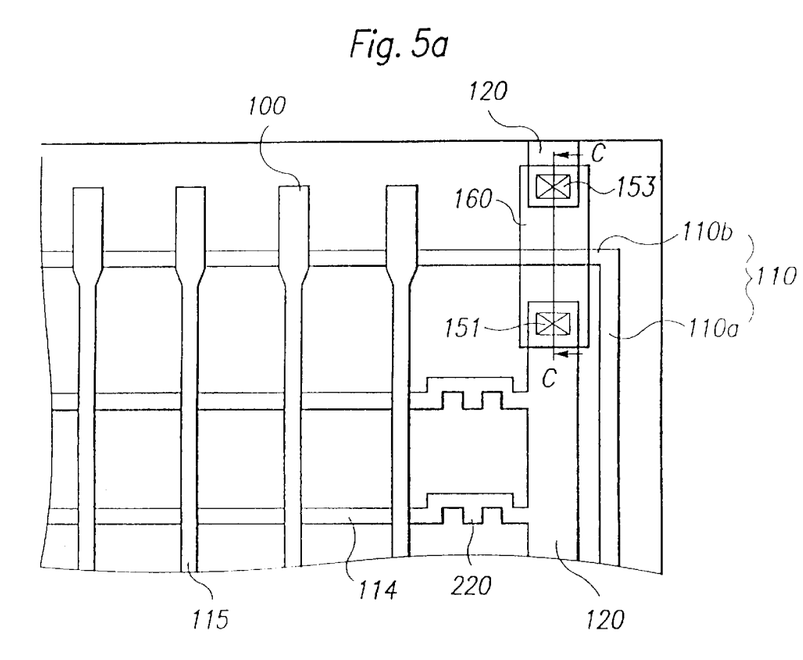
FIGS. 5a and 5b are plan views showing an active panel having a repair line, a gate line and a gate pad according to the second preferred embodiment of the present invention.
Figure 5B:
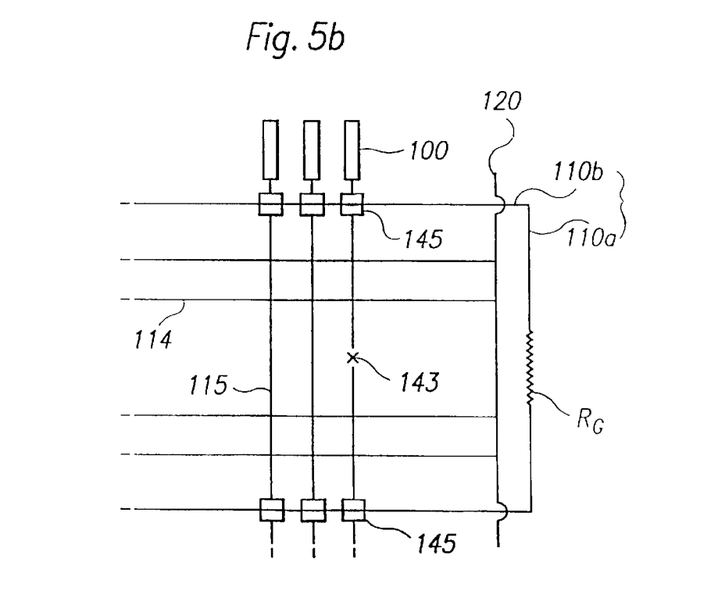
Figure 5C:
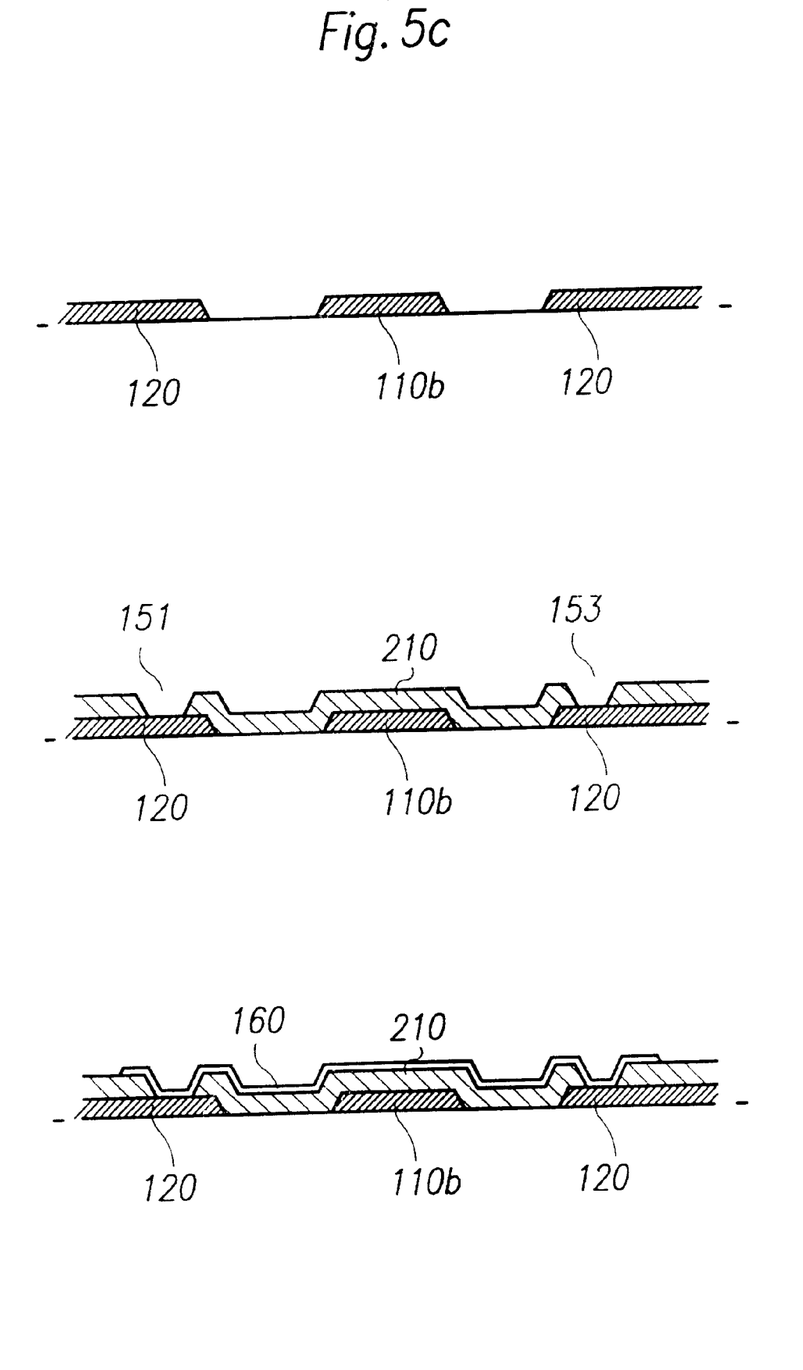
FIG. 5c provides cross-sectional views illustrating a method of manufacturing a repair line according to the second preferred embodiment of the present invention.

In a second preferred embodiment shown in FIGS. 5a–5c, a repair line 110 is preferably formed at the same time that a gate electrode (not shown), a gate line 114 and a gate pad (not shown) are formed using a low resistance metal such s Al, AlNd, Mo and Cu. The repair line 110 comprises a horizontal portion 110b and a vertical portion 110a. The horizontal portion 110b is disposed at a location at which the data line 115 is connected to the data pad 100. The vertical portion 110a is disposed at an area outside of a common line (anti-electrostatic ground line) 120 of the gate line 114 and gate pad (not shown). The repair line 110 is formed as a single integral body, instead of two separate bodies, so that the common line 120 is divided into two portions and connected with a connector 160 through contact holes 151 and 153, as shown in FIG. 5a.

Thus, all portions of the repair lines 110 comprise the low resistance material and all repair lines 110 are made completely of the same low resistance material. Therefore, if a data line 115 is broken by a defect 143, then an intersection point 145 of the data line 115 and the repair line 110 is connected. Generally, a preferred connection method is to weld the cross point 145 using a laser beam. So, the data signal applied to the data line 115 having the defect 143 is detoured through the repair line 110. As a result, the broken data line is repaired, as shown in FIG. 5b.

In this preferred embodiment, it is suggested that the common line 120 is divided into two parts and formed at the same layer of the repair line 110. In that case, the repair line 110 comprises a horizontal portion 110b and a vertical portion 110a which are formed as an integral single body in the same layer. After the gate insulating layer 210 is deposited, contact holes 151 and 153 exposing some of the two portions of the common line 120, respectively, are formed and as a result, the two portions of the common line 120 are connected by a connector 160 comprising a source material, as shown in FIG. 5c.

The preferred embodiments of the present invention provide a repair line including a low resistance material used for a gate electrode, a gate line and a gate pad. Therefore, any delay in transmitting signals caused by the repair line replacing the broken data line is greatly reduced. Hence, the active panel including such a repair line has no limit on a repairing area as opposed to the conventional art in which the repair line comprises source material such as chromium or ITO having a higher resistance than a gate material.

Although the present invention has been explained with reference to preferred embodiments shown in the drawings described above, it should be understood to the ordinary skilled person in the art that the invention is not limited to the preferred embodiments described herein, but rather that various changes or modifications thereof are possible without departing from the spirit of the invention. Accordingly, the scope of the invention shall be determined only by the appended claims and their equivalents.

What is claimed is:

1. A liquid crystal active panel comprising:
   a substrate;
   a display area including a plurality of gate lines on the substrate, a plurality of data lines intersecting the gate lines and a thin film transistor and a pixel electrode disposed at each intersection portion of the gate and the data lines;
   a common line surrounding the display area;
   a pad area including at least one gate pad connected to an end of the gate lines and at least one data pad connected to an end of the data lines;
   a repair line including a horizontal portion and a vertical portion and surrounding the display area, wherein the repair line is located at the pad area and outside of the common line;
   an insulating layer disposed on the common line and the repair line; and
   a connector layer on the insulating layer for electrically connecting the horizontal and the vertical portions of the repair line or end portions of the common line.

2. A liquid crystal active panel according to claim 1, wherein the repair line is located inside of the data pad.

3. A liquid crystal active panel according to claim 1, wherein the repair line and the common line overlap each other and an insulating layer is disposed therebetween.

4. A liquid crystal active panel according to claim 1, wherein the repair line is disposed on a common layer with the gate line.

5. A liquid crystal panel according to the claim 1, wherein at least one of the data lines is connected to the repair line.

6. A liquid crystal panel according to the claim 1, wherein the repair line comprises the same material that the gate line is made of.

7. A liquid crystal panel according to the claim 1, wherein the repair line comprises at least one of Al, AlNd, Mo and Cu.

8. A liquid crystal active panel comprising:
   a substrate;
   a display area including a plurality of gate lines on the substrate, a plurality of data lines intersecting the gate lines and a thin film transistor and a pixel electrode disposed at each intersection portion of the gate lines and the data lines;
   a common line defining an anti-electrostatic guide line surrounding the display area;
   a repair line including a horizontal portion and a vertical portion and surrounding the display area, wherein said common line, said repair line and said plurality of gate lines are located in the same deposition layer and are formed of the same material;
   an insulating layer disposed on the common line and the repair line; and
   a connector layer on the insulating layer for electrically connecting the horizontal and the vertical portions of the repair line or end portions of the common line.

9. A liquid crystal active panel according to claim 8, wherein the repair line is located inside of the data pad.

10. A liquid crystal active panel comprising:
    a substrate;
    a display area including a plurality of gate lines on the substrate, a plurality of data lines intersecting the gate lines and a thin film transistor and a pixel electrode disposed at each intersection portion of the gate lines and the data lines;
    a common line defining an anti-electrostatic guide line surrounding the display area;
    a pad area connected at an end of the data lines;
    a repair line including a horizontal portion and a vertical portion and surrounding the display area, wherein the repair line is located at the pad area and outside of the common line;
    an insulating layer disposed on the common line and the repair line; and
    a connector layer on the insulating layer for electrically connecting the horizontal and the vertical portions of the repair line or end portions of the common line.

11. A liquid crystal active panel according to claim 10, wherein the repair line is disposed on a common layer with the gate line.

12. A liquid crystal panel according to claim 10, wherein at least one of the data lines is connected to the repair line.

13. A liquid crystal panel according to the claim 10, wherein the repair line comprises at least one of Al, AlNd, Mo and Cu.

14. A liquid crystal active panel comprising:
    a substrate;
    a display area including a plurality of gate lines on the substrate, a plurality of data lines intersecting the gate lines and a thin film transistor and a pixel electrode disposed at each intersection portion of the gate lines and the data lines;
    a common line defining an anti-electrostatic guide line surrounding the display area;
    a repair line including a horizontal portion and a vertical portion and surrounding the display area, wherein the repair line and the common line overlap each other and an insulating layer is disposed therebetween;
    an insulating layer disposed on the common line and the repair line; and
    a connector layer on the insulating layer for electrically connecting the horizontal and the vertical portions of the repair line or end portions of the common line.

15. A liquid crystal active panel according to claim 14, wherein the repair line is disposed on a common layer with the gate line.

16. A liquid crystal panel according to claim 14, wherein at least one of the data lines is connected to the repair line.

17. A liquid crystal panel according to the claim 14, wherein the repair line comprises at least one of Al, AlNd, Mo and Cu.

18. A method for manufacturing an active panel of a liquid crystal display device, comprising the steps of:

forming gate lines, gate pads each connected to an end of one of the gate lines, gate electrodes extending from the gate lines, and a repair line surrounding the gate lines on a substrate;

forming an insulation layer covering the repair line, the gate lines, the gate pads and the gate electrodes;

forming data lines so as to intersect with the gate lines and crossing with a part of the repair line, data pads each at the end of one of the data lines, and a common line outside of a display area of the active panel and inside of the repair line, the common line and repair line surrounding the display area; and forming a connector on the insulation layer to electrically connect horizontal and vertical portions of the repair line or end portions of the common line.

19. The method according to the claim 18, further comprising the step of:

connecting the repair line and one of the data lines at intersection point therebetween.

20. The method according to the claim 18, wherein the gate lines, the gate pads, the gate electrodes and the repair line all are formed of a same material.

21. The method according to the claim 18, wherein each of the gate lines, the gate pads, the gate electrodes and the repair line is formed of at least one of Al, AlNd, Co and Cu.

22. The method according to the claim 18, wherein the repair line and the common line intersect each other.

23. A liquid crystal active panel comprising:

a substrate;

a display area including a plurality of gate lines on the substrate, a plurality of data lines intersecting the gate lines and a thin film transistor and a pixel electrode disposed at each intersection portion of the gate lines and the data lines;

a common line defining an anti-electrostatic guide line surrounding the display area;

a repair line including a horizontal portion and a vertical portion;

an insulating layer disposed on said common line; and a connector layer on said insulating layer and on, and electrically connecting together, said horizontal portion and said vertical portion of said repair line, wherein said common line, said repair line and said plurality of gate lines are located in the same deposition layer and are formed of the same material.

24. A liquid crystal active panel comprising:

a substrate;

a display area including a plurality of gate lines on the substrate, a plurality of data lines intersecting the gate lines and a thin film transistor and a pixel electrode disposed at each intersection portion of the gate lines and the data lines;

a common line defining an anti-electrostatic guide line surrounding the display area, wherein a gap exists in said common line thereby defining a first end portion of the common line and a second end portion of the common line;

a repair line including a horizontal portion and a vertical portion;

an insulating layer disposed on the repair line and in the gap; and a connector layer on said insulating layer and on, and electrically connecting together, said first and second end portions of the common line, wherein said common line, said repair line and said plurality of gate lines are located in the same deposition layer and are formed of the same material.

* * * * *